(12) United States Patent
Krishnan et al.

(10) Patent No.: US 8,990,668 B2
(45) Date of Patent: Mar. 24, 2015

(54) DECODING DATA STORED IN SOLID-STATE MEMORY

(71) Applicant: Western Digital Technologies, Inc., Irvine, CA (US)

(72) Inventors: Anantha Raman Krishnan, Irvine, CA (US); Shayan S. Garani, San Diego, CA (US); Kent D. Anderson, Broomfield, CO (US)

(73) Assignee: Western Digital Technologies, Inc., Irvine, CA (US)

( * ) Notice: Subject to any disclaimer, the term of this patent is extended or adjusted under 35 U.S.C. 154(b) by 187 days.

(21) Appl. No.: 13/829,904

(22) Filed: Mar. 14, 2013

(65) Prior Publication Data

US 2014/0281128 A1    Sep. 18, 2014

(51) Int. Cl.
| | | |
|---|---|---|
| H03M 13/00 | (2006.01) | |
| G06F 12/02 | (2006.01) | |
| H03M 13/45 | (2006.01) | |
| H03M 13/39 | (2006.01) | |
| H04L 1/00 | (2006.01) | |
| H03M 13/25 | (2006.01) | |

(52) U.S. Cl.
CPC .......... G06F 12/0246 (2013.01); H03M 13/45 (2013.01); H04L 1/005 (2013.01); H03M 13/256 (2013.01); H03M 13/3905 (2013.01)
USPC .......... 714/799; 714/763; 714/759; 714/792; 714/780; 714/794; 365/185.33; 711/103

(58) Field of Classification Search
CPC ............ H03M 13/45; H03M 13/3905; H03M 13/256; G06F 12/0246; H04L 1/005
See application file for complete search history.

(56) References Cited

U.S. PATENT DOCUMENTS

| | | | |
|---|---|---|---|
| 6,731,700 B1 * | 5/2004 | Yakhnich et al. | 375/341 |
| 6,856,556 B1 | 2/2005 | Hajeck | |
| 6,980,602 B1 | 12/2005 | Kleinerman et al. | |
| 7,126,857 B2 | 10/2006 | Hajeck | |
| 7,430,136 B2 | 9/2008 | Merry, Jr. et al. | |
| 7,447,807 B1 | 11/2008 | Merry et al. | |
| 7,502,256 B2 | 3/2009 | Merry, Jr. et al. | |
| 7,509,441 B1 | 3/2009 | Merry et al. | |
| 7,596,643 B2 | 9/2009 | Merry, Jr. et al. | |
| 7,653,778 B2 | 1/2010 | Merry, Jr. et al. | |
| 7,685,337 B2 | 3/2010 | Merry, Jr. et al. | |
| 7,685,338 B2 | 3/2010 | Merry, Jr. et al. | |
| 7,685,374 B2 | 3/2010 | Diggs et al. | |
| 7,733,712 B1 | 6/2010 | Walston et al. | |
| 7,765,373 B1 | 7/2010 | Merry et al. | |
| 7,800,943 B2 * | 9/2010 | Ravasio et al. | 365/185.03 |
| 7,898,855 B2 | 3/2011 | Merry, Jr. et al. | |
| 7,912,991 B1 | 3/2011 | Merry et al. | |

(Continued)

OTHER PUBLICATIONS

International Search Report and Written Opinion dated Aug. 18, 2014 from related PCT Serial No. PCT/US2014/023800, 13 pages.

(Continued)

*Primary Examiner* — John P Trimmings

(57) ABSTRACT

Embodiments of decoding data stored in solid-state memory arrays are disclosed. In one embodiment, multiple read operations are performed while taking inter-cell interference (ICI) into account. Soft-decision information, such as log-likelihood ratios (LLRs), is determined by using known data and its corresponding multi-read output. Soft-decision information is provided to a detector. Reliability is improved and performance is increased.

30 Claims, 11 Drawing Sheets

(56) References Cited

U.S. PATENT DOCUMENTS

| | | |
|---|---|---|
| 7,936,603 B2 | 5/2011 | Merry, Jr. et al. |
| 7,962,792 B2 | 6/2011 | Diggs et al. |
| 8,078,918 B2 | 12/2011 | Diggs et al. |
| 8,090,899 B1 | 1/2012 | Syu |
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,166,245 B2 | 4/2012 | Diggs et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 2004/0255090 A1* | 12/2004 | Guterman et al. ............ 711/156 |
| 2010/0017684 A1 | 1/2010 | Yang |
| 2010/0174849 A1 | 7/2010 | Walston et al. |
| 2010/0250793 A1 | 9/2010 | Syu |
| 2010/0251076 A1 | 9/2010 | Wu et al. |
| 2011/0072331 A1 | 3/2011 | Sakaue et al. |
| 2011/0099323 A1 | 4/2011 | Syu |
| 2011/0179333 A1 | 7/2011 | Wesel et al. |
| 2011/0246855 A1 | 10/2011 | Cheng et al. |
| 2011/0246859 A1 | 10/2011 | Haratsch et al. |
| 2011/0283049 A1 | 11/2011 | Kang et al. |
| 2012/0072805 A1 | 3/2012 | Tseng et al. |
| 2012/0079355 A1* | 3/2012 | Patapoutian et al. ......... 714/780 |
| 2012/0159285 A1 | 6/2012 | Motwani |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 | 12/2012 | Strange et al. |
| 2013/0007556 A1 | 1/2013 | Patapoutian et al. |
| 2013/0132638 A1 | 5/2013 | Horn et al. |
| 2013/0145106 A1 | 6/2013 | Kan |
| 2013/0290793 A1 | 10/2013 | Booth et al. |
| 2014/0059405 A1 | 2/2014 | Syu et al. |
| 2014/0089764 A1* | 3/2014 | Goldman et al. ............. 714/773 |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0157084 A1* | 6/2014 | Shalvi et al. .................. 714/768 |
| 2014/0181432 A1 | 6/2014 | Horn |
| 2014/0223255 A1 | 8/2014 | Lu et al. |

OTHER PUBLICATIONS

Guangming Lu, et al., U.S. Appl. No. 13/742,243, filed Jan. 15, 2013, allowed Oct. 8, 2014, 28 pages.

* cited by examiner

|   | 1 | 2 | 3 | 4 | 5 | 6 | 7 | 8 | 9 | 10 |
|---|---|---|---|---|---|---|---|---|---|---|
|   | (x, L)\(y) | Number of occurrences of (x, L) | 000 | 001 | 010 | 011 | 100 | 101 | 110 | 111 |
| A | 000 | 2 | 1 | 1 | 0 | 0 | 0 | 0 | 0 | 0 |
| B | 001 | 3 | 1 | 0 | 1 | 0 | 0 | 0 | 1 | 0 |
| C | 010 | 8 | 2 | 1 | 0 | 0 | 1 | 0 | 1 | 3 |
| D | 011 | 4 | 1 | 0 | 0 | 1 | 0 | 0 | 2 | 0 |
| E | 100 | 3 | 1 | 1 | 0 | 1 | 0 | 0 | 0 | 1 |
| F | 101 | 9 | 2 | 0 | 1 | 1 | 2 | 0 | 1 | 2 |
| G | 110 | 4 | 0 | 0 | 0 | 0 | 2 | 0 | 0 | 1 |
| H | 111 | 2 | 1 | 1 | 0 | 0 | 0 | 0 | 0 | 0 |

*FIGURE 4*

DECODING DATA STORED IN SOLID-STATE MEMORY

BACKGROUND

1. Technical Field

This disclosure relates to data storage systems for computer systems. More particularly, the disclosure relates to decoding data stored in a solid-state memory.

2. Description of the Related Art

Data stored in data storage systems is commonly encoded to ensure reliability. When encoded data is retrieved from a storage medium, a decoder is utilized to obtain original data from the encoded data. Soft-decision decoders can improve the reliability of data storage systems and reduce the number of data errors. Generation of soft-decision information, such as log-likelihood ratio (LLR) information, is challenging and time-consuming. Accordingly, it is desirable to provide more efficient mechanisms for generating soft-decision information.

BRIEF DESCRIPTION OF THE DRAWINGS

Systems and methods that embody the various features of the invention will now be described with reference to the following drawings, in which:

FIG. 4 illustrates a table for generating soft-decision information according to one embodiment of the invention.

DETAILED DESCRIPTION

While certain embodiments are described, these embodiments are presented by way of example only, and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

Overview

Data storage systems can utilize solid-state flash memory for storing data. With an increase in the capacity of data storage systems, densities of flash memories are also increased. With decreasing sizes and increasing densities of flash memories, inter-cell interference can adversely affect the reliability of stored data and increase the number of data errors. Error correction codes can be used to encode data before storing the data in data storage systems. However, as solid-state memory undergoes program/erase cycles and degrades due to use, it becomes more difficult to correctly extract data stored in the memory. One reason for data errors is the reduction of margins between different memory states of a solid-state memory cell, and the attendant difficulty in setting appropriate voltage thresholds for reading in order to correctly retrieve the stored data. Providing soft-decision information or soft-information about stored data to a decoder can improve the reliability of data storage systems and reduce the number of data errors. It is challenging to generate soft-decision information, such as log-likelihood ratios (LLRs), for a solid-state memory due to, for example, a varying number of P/E cycles, a varying number of reads, and a varying operating temperature.

Some embodiments of the present invention are directed to decoding data stored in a solid-state memory array by performing multiple read operations and taking into account inter-cell interference (ICI). In some embodiments, soft-decision information, such as LLRs, is generated for the solid-state memory with inter-cell interference. Soft-decision information can be indicative of the reliability of the memory. Soft-decision information is provided to a detector which further enhances it. In one embodiment, soft-decision information is determined using known data and its corresponding multi-read output. In some embodiments, this is achieved by writing known test data into a portion of the memory and, later, detecting and decoding the known data. In other embodiments, this is achieved by successfully detecting and decoding previously unknown data stored in a portion of the memory. Accordingly, reliability is improved and performance is increased.

System Overview

Figure 1A:
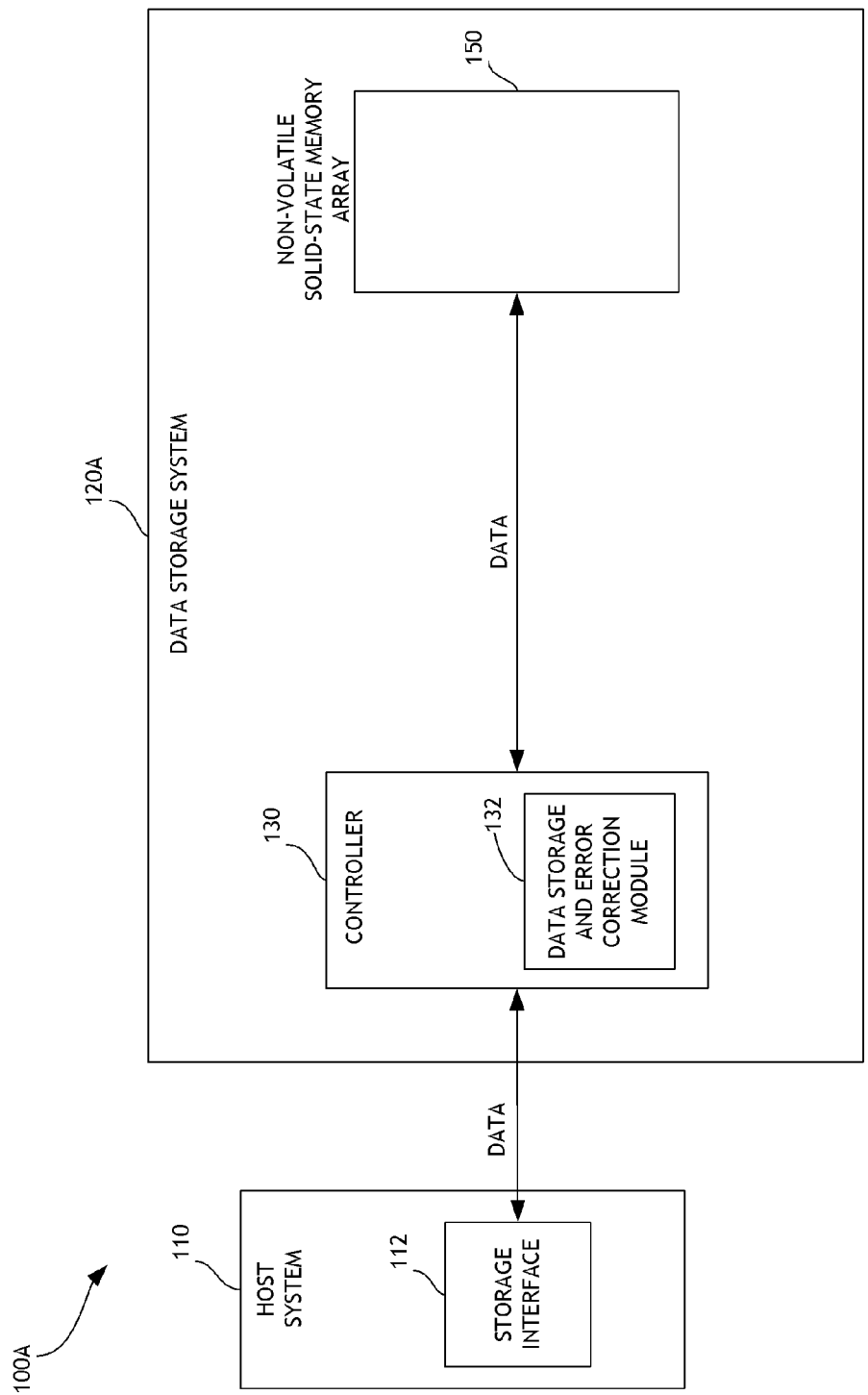
FIG. 1A illustrates a combination of a host system and a data storage system according to one embodiment of the invention.

FIG. 1A illustrates a combination 100A of a host system and a data storage system according to one embodiment of the invention. As is shown, the data storage system 120A (e.g., a solid-state drive) includes a controller 130 and a non-volatile solid-state memory array 150. The solid-state memory array 150 may comprise flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof. In one embodiment, the memory array 150 comprises two-bit MLC NAND memory. The data storage system 120A can further comprise other types of storage.

The controller 130 can be configured to receive data and/or storage access commands from a storage interface module 112 (e.g., a device driver) of a host system 110. Storage access commands communicated by the storage interface 112 can include write data and read data commands issued by the host system 110. Read and write commands can specify a logical address (e.g., logical block addresses or LBAs) used to access the data storage system 120A. The controller 130 can execute the received commands in the solid-state memory array 150.

Data storage system 120A can store data communicated by the host system 110. In other words, the data storage system 120A can act as memory storage for the host system 110. To facilitate this function, the controller 130 can implement a logical interface. The logical interface can present to the host system 110 data storage system's memory as a set of logical addresses (e.g., contiguous address) where user data can be stored. Internally, the controller 130 can map logical addresses to various physical locations or addresses in the solid-state memory array 150 and/or other storage modules. The controller 130 includes a data storage and error correction module 132 configured to store data in and retrieve data from the solid-state memory array 150, encode data, detect and decode data, determine integrity of data retrieved from the solid-state memory array, perform, if necessary, error correction of retrieved data, and perform transfer of data between the data storage system 120A and the host system 110.

Figure 1B:
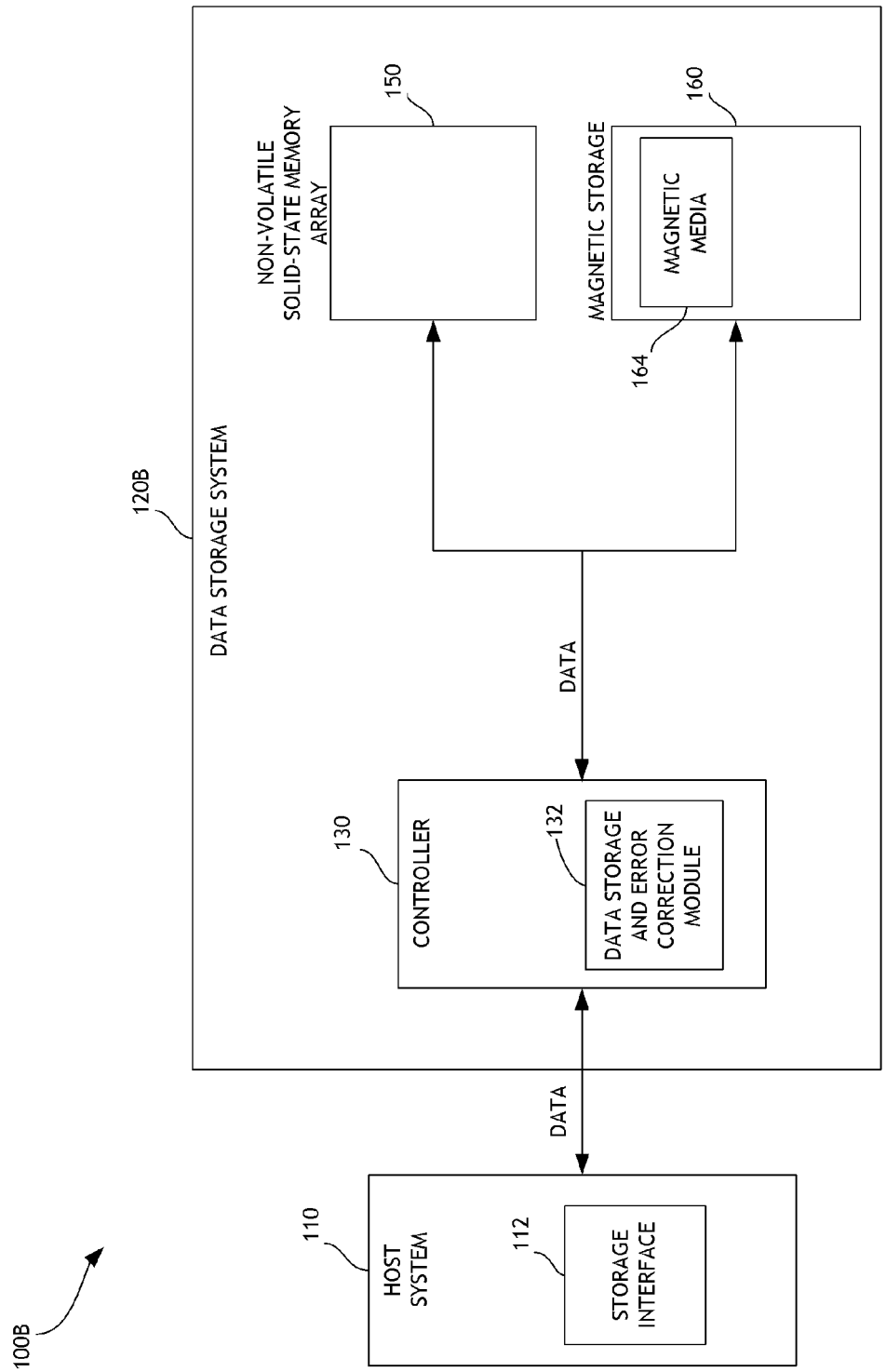
FIG. 1B illustrates a combination of a host system and a data storage system according to another embodiment of the invention.

FIG. 1B illustrates a combination 100B of a host system and a data storage system according to another embodiment of the invention. As is illustrated, data storage system 120B (e.g., hybrid disk drive) includes the controller 130, solid-state memory array 150, and magnetic storage 160, which comprises magnetic media 164. These and other components of the combination 100B are described above.

Decoding of Stored Data

Figure 2:
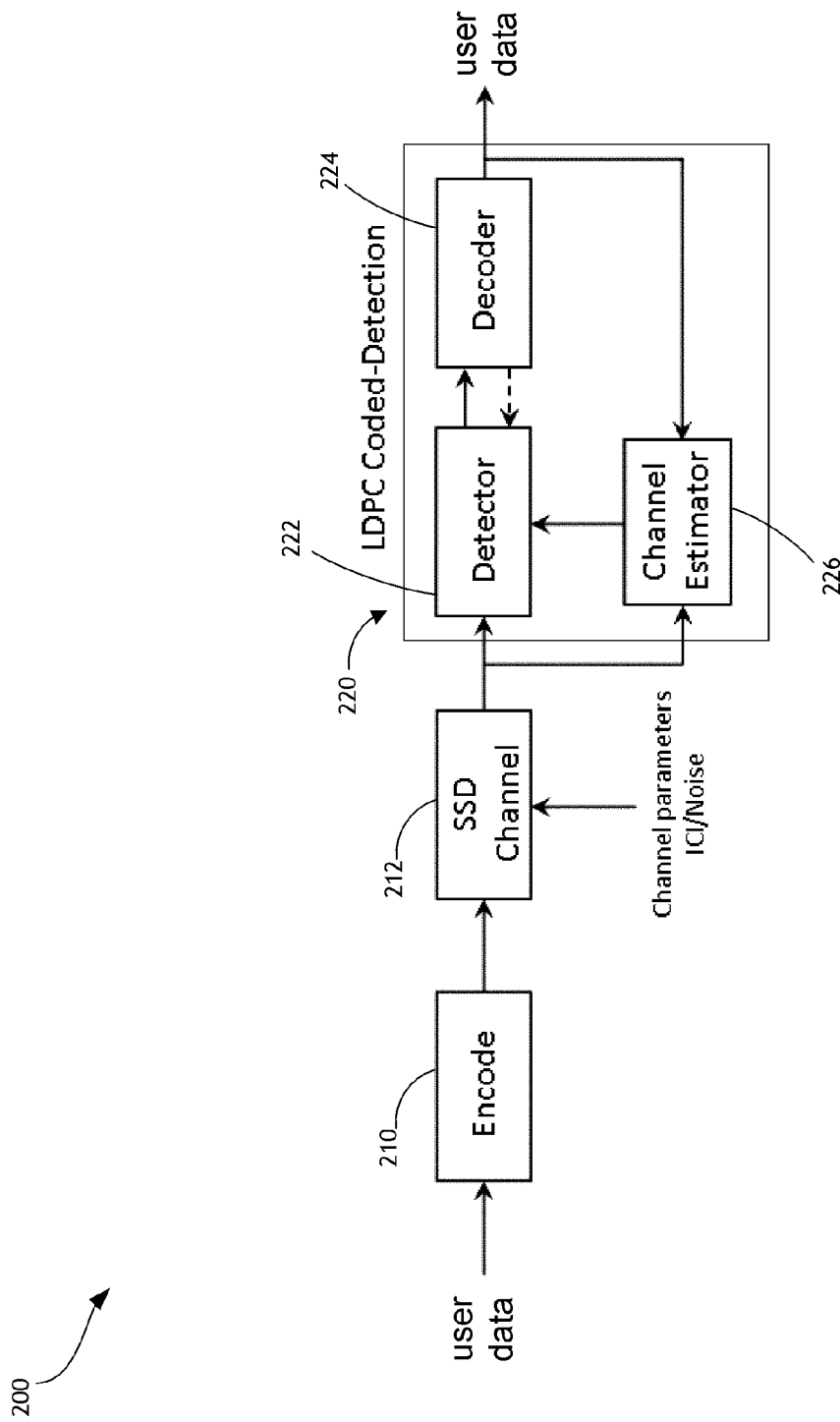
FIG. 2 illustrates an encoder and decoder of user data according to one embodiment of the invention.

FIG. 2 illustrates an encoder and decoder 200 according to one embodiment of the invention. In one embodiment, encoding and decoding is performed by the controller 130, such as, for example, by the data storage and error correction module 132. User data received from the host system 110 is encoded by the encoder 210. In one embodiment, the encoder 210 uses low-density parity check (LDPC) codes for encoding. In block 212, encoded data is stored in the memory array 150. Encoded data can be referred to as codewords. Further, using the analogy of communicating data over a channel, the memory array can be thought of as the communication channel and storing the data can be thought of transmitting the data over the channel. The memory array channel is characterized by various parameters, such as inter-cell interference, inter-page interference, number of P/E cycles, wear, operating temperature, etc. One or more of these parameters introduces noise (or data errors) into to the stored data.

Stored data is detected and decoded in block 220. In one embodiment, block 220 is an LDPC decoder. Data retrieved from the memory array 150 (or a codeword) is detected in detector 222. As the memory array 150 channel can transform the codeword to be stored in the memory into a format used by the channel, the detector 222 is used to detect the data retrieved from the memory array channel (i.e., to detect the channel output) and to convert the retrieved data back into the same format that was used when the codeword was provided for storage in the memory array. The detector 222 uses information derived by a channel estimator 226. The channel estimator 226 can generate statistical information. The detector 222 can use the information from the channel estimator 226 to generate soft-decision information, such as LLRs. Soft-decision information is used by a decoder 224 to decode the codewords and obtain user data.

Figure 3:
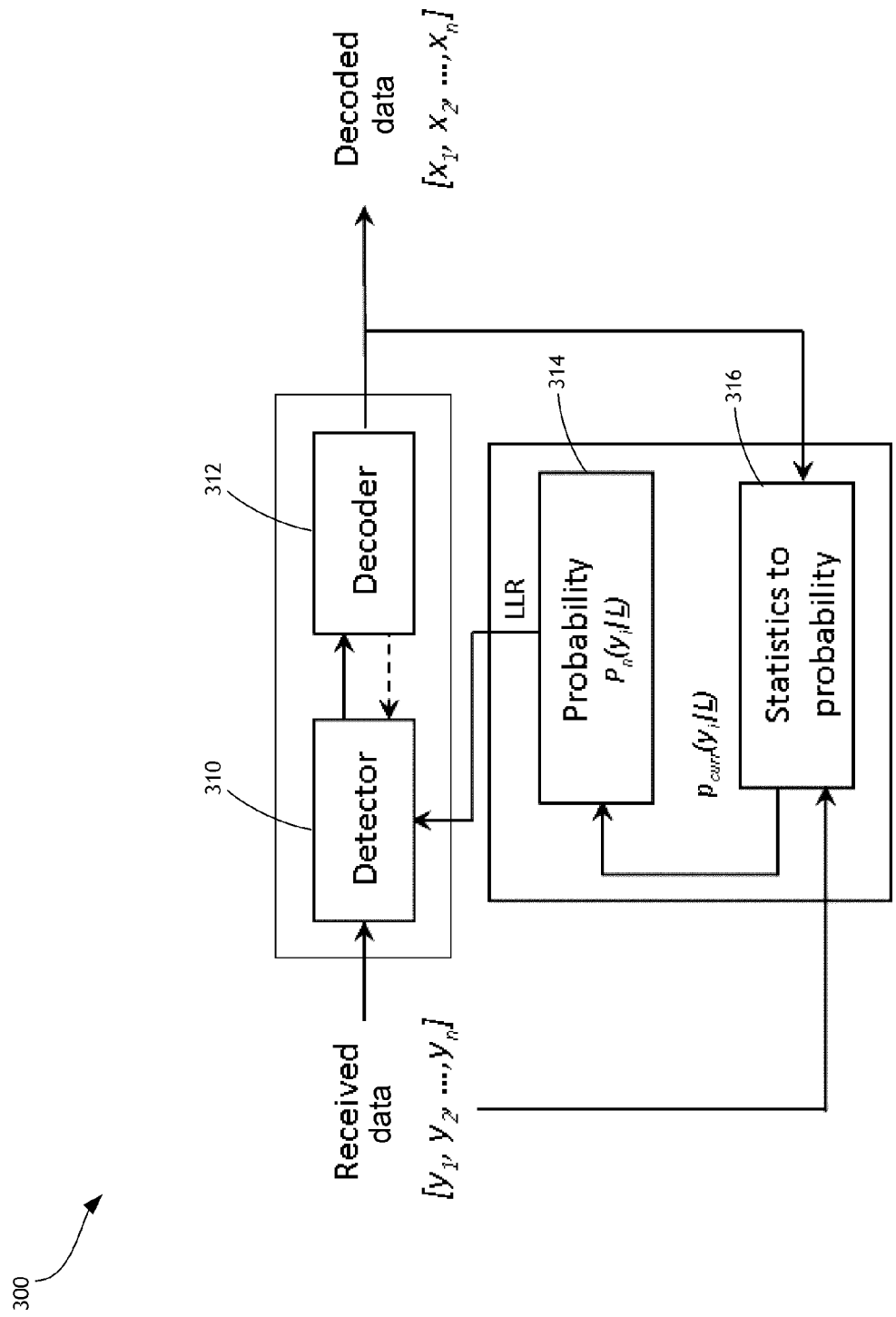
FIG. 3 illustrates a data detector and decoder according to one embodiment of the invention.

FIG. 3 illustrates a data detector and decoder 300 according to one embodiment of the invention. In one embodiment, data detection and decoding is performed by the controller 130, such as, for example, by the data storage and error correction module 132. The data detector and decoder 300 receives encoded data retrieved from the memory array 150. A detector 310 uses soft-decision information, such as LLRs, generated by a statistics module 316 and a probability module 314. The soft-decision information is provided to the decoder 312, which can be an LDPC decoder. The decoder 312 decodes the detected encoded data (or codewords). The statistics module 316 generates the probability information based on analysis of decoded data and/or other data. As further described below, in one embodiment, the statistics module 316 generates the probability information by analyzing occurrences of bit patterns in values obtained in a multi-read scheme, and the probability module 314 in turn generates the soft-decision information based on the output of the statistics module 316.

Soft-Decision Information Generation—Generating Probability Information from Statistical Information FIG. 4 illustrates a table 400 for generating soft-decision information according to one embodiment of the invention. In one embodiment, the table 400 is generated by the controller 130, such as, for example, by the data storage and error correction module 132. In one embodiment, the table 400 is generated by the statistics module 316 by performing multiple reads with varying read voltages on a reference memory location, which may refer to different portions of the memory array depending on the embodiments. For example, the memory array can be divided into blocks, which are further divided into pages. In one embodiment, the reference memory location is a memory page where known data is stored. In other embodiments, the reference memory location may refer to a cell, partial page, set of partial pages, set of pages, block, set of blocks, and/or any other suitable grouping of memory array locations where known data is stored. In one embodiment, known data corresponds to training data stored in the memory page. In another embodiment, known data corresponds to successfully decoded data. For example, the data storage system 120A or 120B can be reading a set of memory pages, and known data can correspond to data successfully read from a page in the set. In yet another embodiment, a combination of training data and successfully decoded data can be used as known data.

As one example, the memory location analyzed by the statistics module 316 can be a reference page with known bit values or a page that is successfully decoded. Depending on the size of the page, there may be around 512, 1,024, 2,048 or more memory cells, with each cell being associated with multiple values, one per each of multiple reads, in addition to its original known value. In one embodiment these values may correspond to bits and in other embodiments the values may correspond to two or more bits. This is illustrated in the example table (Table 1) below.

TABLE 1

|  | Cell 0 | Cell 1 | Cell 2 | Cell 3 | Cell 4 | Cell 5 | ... | Cell N |
|---|---|---|---|---|---|---|---|---|
| Known Value | 0 | 0 | 0 | 1 | 1 | 1 | ... | 0 |
| Read No. 1 | 0 | 0 | 0 | 0 | 0 | 1 | ... | 0 |
| Read No. 2 | 0 | 0 | 0 | 1 | 0 | 1 | ... | 0 |
| Read No. 3 | 0 | 1 | 0 | 1 | 1 | 1 | ... | 1 |

Returning to FIG. 4, the legend in column 1 of table 400 corresponds to a neighborhood of a memory array 150 location, such as a memory cell and its neighboring cells. For example, the memory array location $X_i$ (e.g., a cell) can have immediate neighbors being $X_{i-1}$ and $X_{i+1}$. For example, in the table above, the bolded bits at cells 0-2 could be considered the tuple $\{X_{i-1}, X_i, X_{i+1}\}$, with $X_i$ corresponding to cell 1. The notation L denotes information related to the channel parameters, which in this case is focused on the effect of neighboring cells have on the cell in question ($X_i$). In one embodiment, the memory array location is a cell that stores a single bit of binary data, which takes one values of 0 or 1. Accordingly, there can be eight (or $2^3$) combinations of different bit values or patterns for a sequence $\{X_{i-1}, X_i, X_{i+1}\}$ (or X, L) of neighboring memory locations. These different combinations are reflected in column 1 of table 400. Cells 0-2 above (with values "000") is one instance of the combination reflected in cell A-1 of table 400.

Memory location $X_i$ can be read multiple times. In one embodiment, the memory location can be read three times at multiple voltage thresholds for reading solid-state memory. The thresholds for the three reads can be different, same, or one threshold can be used for two of the three reads and another threshold can be used for the remaining read operation. Aggregate tallies of the values obtained during the multiple reads are shown in columns 3 through 10 of table 400 for various bit patterns stored in $\{X_{i-1}, X_i, X_{i+1}\}$. Each box in columns 3 through 10 indicate a tally of the number of occurrence of a particular bit pattern within the values obtained from the multiple reads. For example, the value "1" in row A, column 4 of table 400 indicates that, among the values returned from the multiple reads, for the pattern of neighboring bits "000" with three reads of the middle bit ($X_i$), there was one occurrence of returned values 0, 0, and 1 on the first, second, and third reads (e.g., using three read thresholds). As is reflected by the pattern "000", the middle memory location (or $X_i$) stores the value of 0. This corresponds to cells 0-2 in the above example table, and the multi-read read value of cell 1 being 0, 0, 1 for the three reads, respectively. In other words, the value "1" in row A, column 4 of table 400 indicates among the hundreds or thousands of bits in the memory page that was read, this particular pattern only appeared once, at cell 1. In one embodiment, bits in columns 3 through 10 can be ordered to indicate third, second, and first read respectively or any other suitable order.

Column 2 of table 400 corresponds to a total number of occurrences in the known data of a particular bit pattern in column 1 stored in the memory location sequence $\{X_{i-1}, X_i, X_{i+1}\}$. For example, the value "2" in row A, column 2 of table 400 indicates that the pattern of neighboring bits "000" occurs twice in the known data. As another example, the value "9" in row F, column 2 of table 400 indicates that the pattern of neighboring bits "101" occurs nine times in the known data.

In one embodiment, data in table 400 is used to generate probability information for generating soft-decision information. The probability of multi-read output $Y_i$ of a memory location $X_i$, which neighbors $L_i = \{X_{i-1}, X_{i+1}\}$ is determined according to:

$$P(Y_i \mid X_i, L_i) = \frac{\#(Y_i, X_i, L_i)}{\#(X_i, L_i)} \quad (1)$$

where $\#(Y_i, X_i, L_i)$ is the total number of occurrences of the bits stored in $(X_i, L_i)$ with the corresponding multi-read value being $Y_i$ (i.e., as is indicated in columns 3-10), and $\#(X_i, L_i)$ being the total number of occurrences of the pattern $(X_i, L_i)$ (as is indicated in column 2). For example, the probability of a multi-read output Y of a memory $X_i$ location being "001" given that the stored data pattern of the neighboring bits $\{X_{i-1}, X_i, X_{i+1}\}$ is "000" can be determined as follows. Row A, column 4 of table 400 corresponds to a sequence "001" for the three reads of memory location $X_i$. As is indicated by the value "1" in the table, the sequence "001" occurred once. The pattern of neighboring bits "000" occurred twice in the known bit sequence of the memory page, as is indicated by "2" in row A, column 2. Hence, $P(Y_i=001|X_i=0, [X_{i-1}=0, X_{i+1}=0])$ is ½ (or 0.5).

In some embodiments, neighboring memory locations that are not immediate neighbors of the memory location $X_i$ are used. Any suitable number of neighboring memory locations can be used. In some embodiments, non-neighboring locations are used. In some embodiments, the number of reads performed on the memory location $X_i$ is any integer value, such as a value that is smaller than three or greater than three. In some embodiments, the same reading threshold is used for all read operations or the same voltage threshold is used for multiple read operations while one or more different voltage thresholds are used for other read operations.

Figure 5:
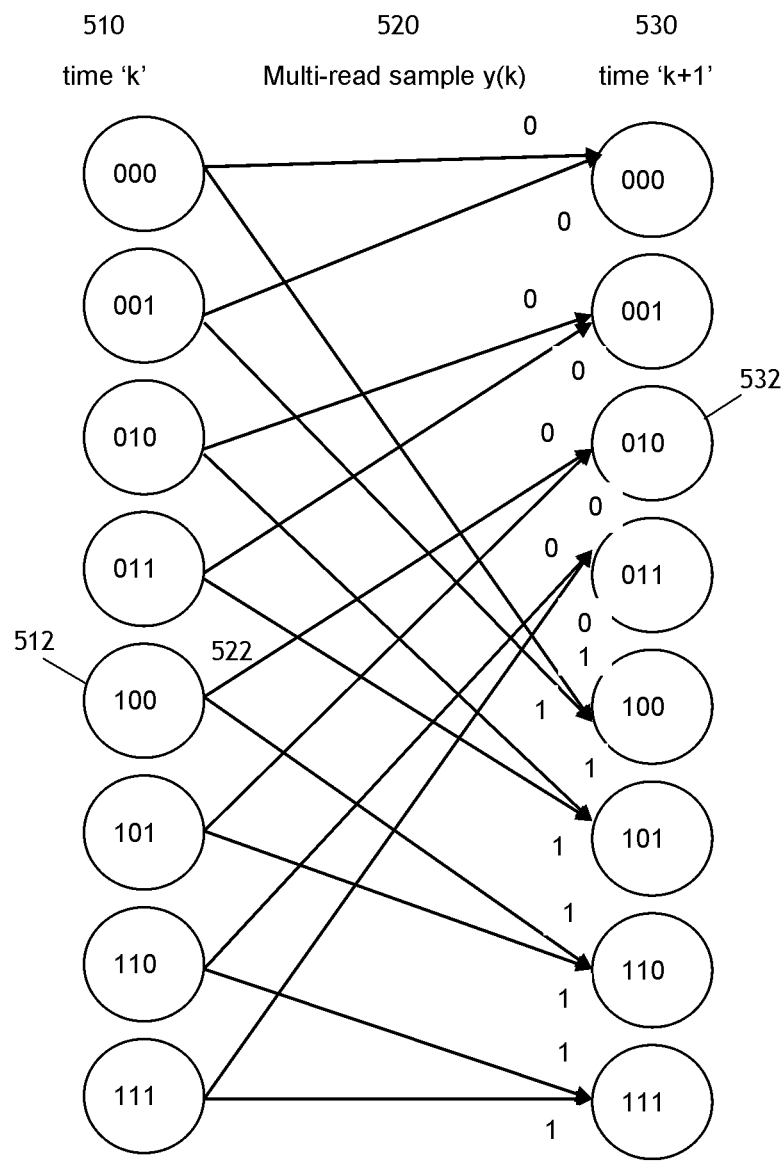
FIG. 5 illustrates a trellis diagram for generating soft-decision information according to one embodiment of the invention.

Soft-Decision Information Generation—Generating Soft-Decision Information from the Probability Information Using a Trellis-Based Algorithm In one embodiment, once the probability values are generated from the statistics module 316, the probability module 314 computes soft-decision information that is used for decoding (e.g., LLRs). FIG. 5 illustrates a trellis diagram 500 for generating soft-decision information according to one embodiment of the invention. The trellis 500 can be generated by the controller 130, such as, for example, by the data storage and error correction module 132. In one embodiment, the trellis 500 is used by the detector 310. The trellis 500 can be used to derive soft-decision information using a soft output Viterbi algorithm (SOVA), BCJR algorithm, etc.

In one embodiment, the trellis 500 can be used to find a most likely path, which corresponds to the most likely sequence of values stored in a memory location, such as a memory page. As is illustrated in FIG. 5, states 510 correspond to the bits stored in $(X_i, L_i)$ (or $\{X_{i-1}, X_i, X_{i+1}\}$) at time k and states 530 corresponds to the bits stored in $(X_{i+1}, L_{i+1})$ (or $\{X_i, X_{i+1}, X_{i+2}\}$) at time k+1. Transitions 520 correspond to transitions made from states 510 to states 520 when next bit (or data value) is read from the memory. For example, suppose that the data storage system 120A or 120B reads a memory page comprising multiple memory locations storing individual data bits. The memory page can be a reference page storing known data or a target page whose data is to be detected and decoded. The data storage system reads a bit sequence $b_0, b_1, b_2, \ldots, b_{M-1}$ corresponding to data stored in the individual memory locations. This raw bit sequence is then detected by, for example, the detector 310, which can convert the bit sequence to soft decision information which is used by the decoder 312 which can convert the soft decision information into the user data that was stored in the memory page. Using the probability information generated by the statistics module 316, the detector 310 can find a path that minimizes the probability of one or more memory errors, such as read errors.

For instance, suppose that at a given time k, a memory location, such as a memory cell, is read three times, and a sequence "111" is returned by the read operations. That is, the first, second, and third read operations return a value "1" as the value stored in the memory location. The trellis 500 can be used to find the bit sequences $\{X_{i-1}, X_i, X_{i+1}\}$ and $\{X_i, X_{i+1}, X_{i+2}\}$, which correspond to a reference memory location ($X_i$) and its neighbors at times k and k+1. The starting and ending states from the groups 510 and 530 can be determined such that the probability of a read error is reduced or minimized. The starting states 510 are assigned probabilities based on initial values, and on the forward and backward probabilities α and β introduced below. In one embodiment, initially (e.g., at time 0) all starting states 510 can be assigned equal probabilities. Suppose that at time k, the starting state having the highest probability is state 512, which is associated with the bit pattern "100". The next state (at time k+1) can be determined by following a path having the highest probability. With reference to table 400, column 10 corresponds to information for the "111" multi-read sequence of the memory cell $X_i$. The largest probability is ⅜ associated with row C, column 10 (i.e., row C, column 10 stores "3" and row C, column 2 stores "8"), which corresponds to the bit pattern "010"

stored in the neighboring memory locations $\{X_i, X_{1+1}, X_{i+2}\}$. Accordingly, the next state is "010" or state 532 as the probability associated with the transition 522 is ⅜. Note that in the illustrated embodiment, the new bit ($X_{i+2}$) is appended at the leftmost side of the bit sequence. In another embodiment, the new bit can be appended at the rightmost side, in the middle, etc.

In one embodiment, the trellis 500 can be generated for memory cells $X_0, X_1, X_2, \ldots, X_{M-1}$ of an M-cell memory page. In such case, the trellis 500 can have M+1 groups of states and M transitions between the groups of states. Each memory cell $X_i$ can be read multiple times to produce multi-read values. Weights are assigned to the transitions 530 using information in the table 400. For example, as explained above, weight ⅜ is assigned to a transition 522 between states 512 and 532. In another embodiment, a value between 0 and 1 scaled by the weight is assigned to the transition 522 between states 512 and 532.

In one embodiment, the BCJR algorithm can be used to derive soft-decision information, such as LLRs. The BCJR algorithm uses the information in table 400 and the trellis 500. Let s be a state of the trellis at time 't' and s' be a trellis state at time 't+1,' where s' is connected to s by a transition. Let $\gamma_t(s,s')$ denote the branch metric or weight assigned to the transitions 520. The branch metric can be the conditional probability of the received sample Y(t) given the transition bit for the state pairs (s, s') computed empirically using table 400. For example, the branch metric or weight assigned to the transition 522 is ⅜. Forward probability ($\alpha$) and backward probability ($\beta$) can be computed recursively as:

$$\alpha_{t+1}(s') = \sum_s \alpha_t(s)\gamma_t(s, s') \quad (2)$$

$$\beta_t(s) = \sum_{s'} \beta_{t+1}(s')\gamma_t(s, s') \quad (3)$$

$$\gamma_t(s, s') = Pr(Y(t) | X(t)) \quad (4)$$

LLRs can be computed as:

$$LLR(X_k) = \log_{10}\left(\frac{Pr(X_k = 0)}{Pr(X_k = 1)}\right) \quad (5)$$

$$= \frac{\sum_{(s,s')=0} \alpha_{k+1}(s')\gamma_k(s, s')\beta_k(s)}{\sum_{(s,s')=1} \alpha_{k+1}(s')\gamma_k(s, s')\beta_k(s)}$$

In one embodiment, soft-decision information, such as LLRs, is used to as an input to the decoder which decodes data stored in a target memory location, such as a target memory page. For instance, LLR($X_k$) can be used with the decoder 312. Soft-decision information is generated by reading and detecting known data stored in a reference memory location that has similar properties as the target memory location. For example, memory pages in the same memory block are likely to have similar properties as these pages have experienced the same or similar number of P/E cycles, wear, inter-cell interference, inter-page interference, operating or ambient temperature, and the like. As another example, memory locations having the same position within a first and second page (which may or may not be neighboring pages) are likely to have similar properties.

Soft-Decision Information Generation and Application Processes

Figure 6A:
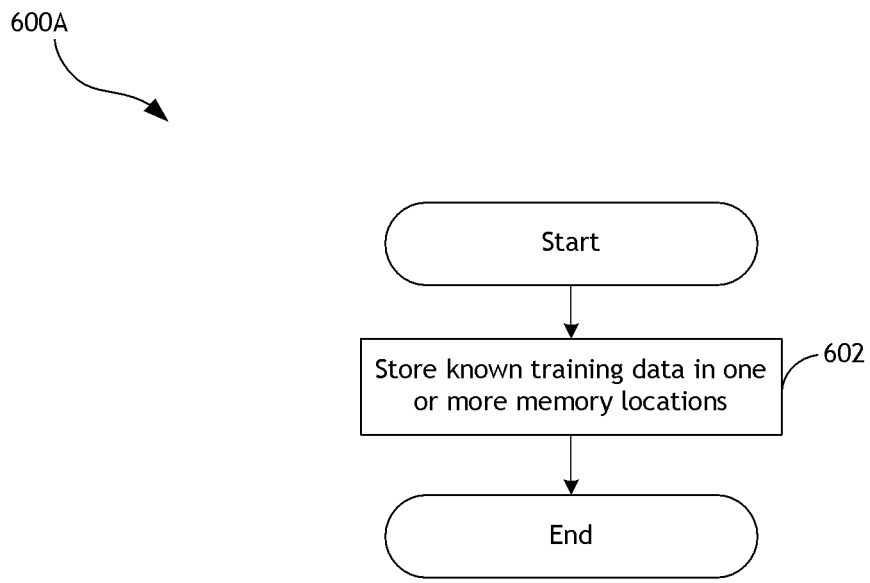
FIGS. 6A-6D are flow diagrams illustrating processes of reading stored data according to some embodiments of the invention.

FIGS. 6A-6D are flow diagrams illustrating processes of reading stored data according to some embodiments of the invention. The illustrated processes can be executed by the controller 130 and/or the data storage and error correction module 132. FIG. 6A is a flow diagram illustrating a process 600A for storing, in block 602, known training data in the memory array 150. Known training data can be stored in one or more memory locations. For example, known training data can be stored in one or more pages for every block in the memory array 150. As another example, known training data can be stored in one or more pages selected from every N blocks, where N is an integer number. For instance, known training data can be stored in a page selected from three neighboring blocks.

Figure 6B:
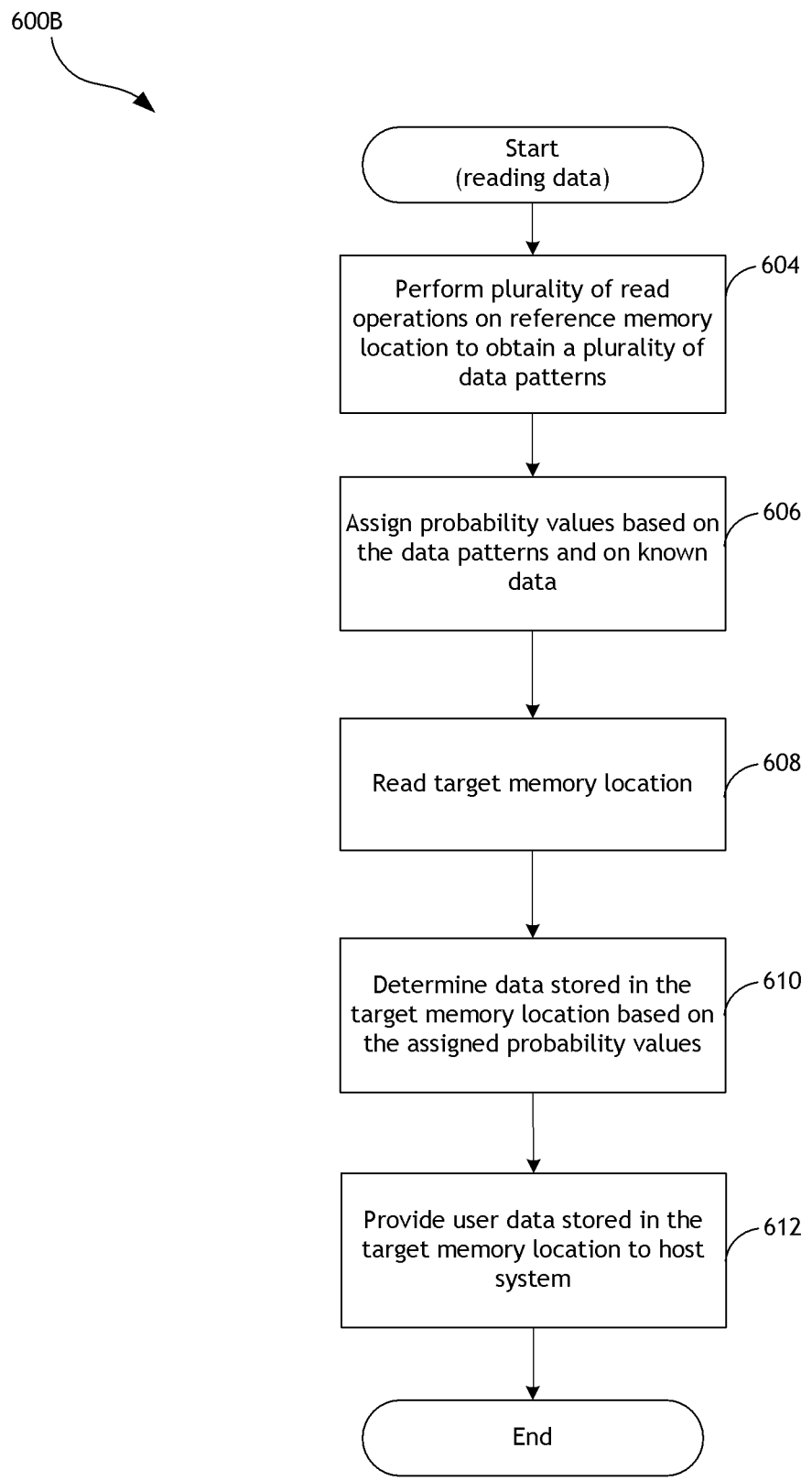

FIG. 6B is a flow diagram illustrating a process 600B for reading stored data using known training data stored according to the process 600A or using data that has been successfully decoded. In one embodiment, the process 600B detects and decodes data stored in a target memory location. In block 604, the process 600B performs a plurality of read operations on a reference memory location. The reference memory location can store known training data (e.g., which can be stored in accordance with the process 600A). In one embodiment, the reference memory location can be a memory page. In another embodiment, the reference memory location can be a partial page, page, number of pages, block, number of blocks, and the like or any combination thereof. The process 600B performs multiple read operations on the reference memory location, thereby obtaining a plurality of data patterns stored in the memory location. For example, the process 600B obtains multi-read values for memory cells $X_0$ through $X_{M-1}$ of the reference memory page. Because reference data is known, the process 600B can construct a table similar to table 400. The process 600B transitions to block 606, where the process assigns probability values based on the known training data and on the data patterns. In one embodiment, the process 600B generates a trellis similar to the trellis 500 and assigns weights to the trellis. The weights are determined from the probability values from the table. Using the trellis, the process 600B can determine soft-decision information, such as LLRs.

The process 600B transitions to block 608, where the process performs one or more read operations on a target memory location. In one embodiment, operations in blocks 604 and 606 can be performed before the one or more read operations are performed in block 608. The target memory location can be a memory page. In another embodiment, the target memory location can be a partial page, page, number of pages, block, number of blocks, and the like or any combination thereof. In one embodiment, the target memory location can be a memory page that has properties similar to those of the reference memory page. In one embodiment, the process 600B performs a single read operation in block 608, and determines whether that operation causes read error(s) to occur. If no error(s) occur, the process 600B does not perform multiple reads. On the other hand, if one or more errors occur, the process 600B performs multiple read operations on the target memory location. For example, the process 600B can read each cell in the target memory page a number of times (e.g., three) using different voltage thresholds.

The process 600B transitions to block 610 where it determines stored data based on the probability values assigned in block 606. In one embodiment, the process 600B detects and decodes stored data using LLRs generated in block 606. The process 600B transitions to block 612 where it provides user data stored in the target memory location to the host system 110. Optionally, prior to transitioning to block 610, the process 600B can determine whether one or more read error(s) occurred while reading the target memory location. Optional checking for read error(s) can be particularly applicable in the case when the target memory location is read multiple times. If no read error(s) have been encountered, the process 600B can transition to block 612 where it returns user data stored in the target memory location to the host system 110. If the process 600B determines that one or more read error(s) have occurred during reading the target memory location, the process can transition to block 610. In some embodiments, tables for generating soft-decision information corresponding to performing single read and multiple reads of a memory location can be generated and used by the process 600B. For example, several tables similar to table 400 can be generated and utilized.

Figure 6C:
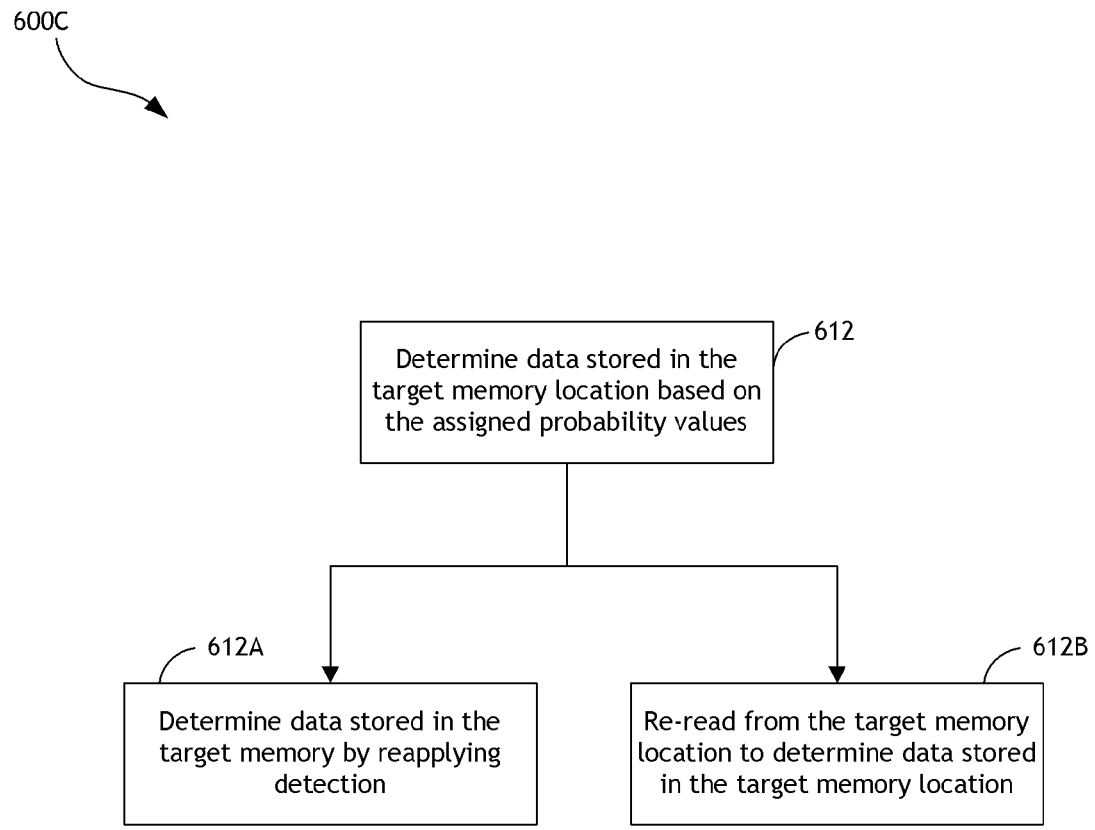

FIG. 6C is a flow diagram illustrating a process 600C for performing the operation of block 612 (i.e., determination of data stored in the target memory location). In block 612A, the process 600C determines stored data by reapplying detection to already retrieved data. For example, stored data has already been read in block 608, and detection and/or decoding based on the probability values can be reapplied to that data. On the other hand, in block 612B the process 600C 600D can re-read data stored in the target memory location and apply detection and/or decoding to the re-read data. In one embodiment, the process 600C attempts to perform the operations in block 612A before transitioning to block 612B, where it re-reads the target memory location.

Figure 6D:
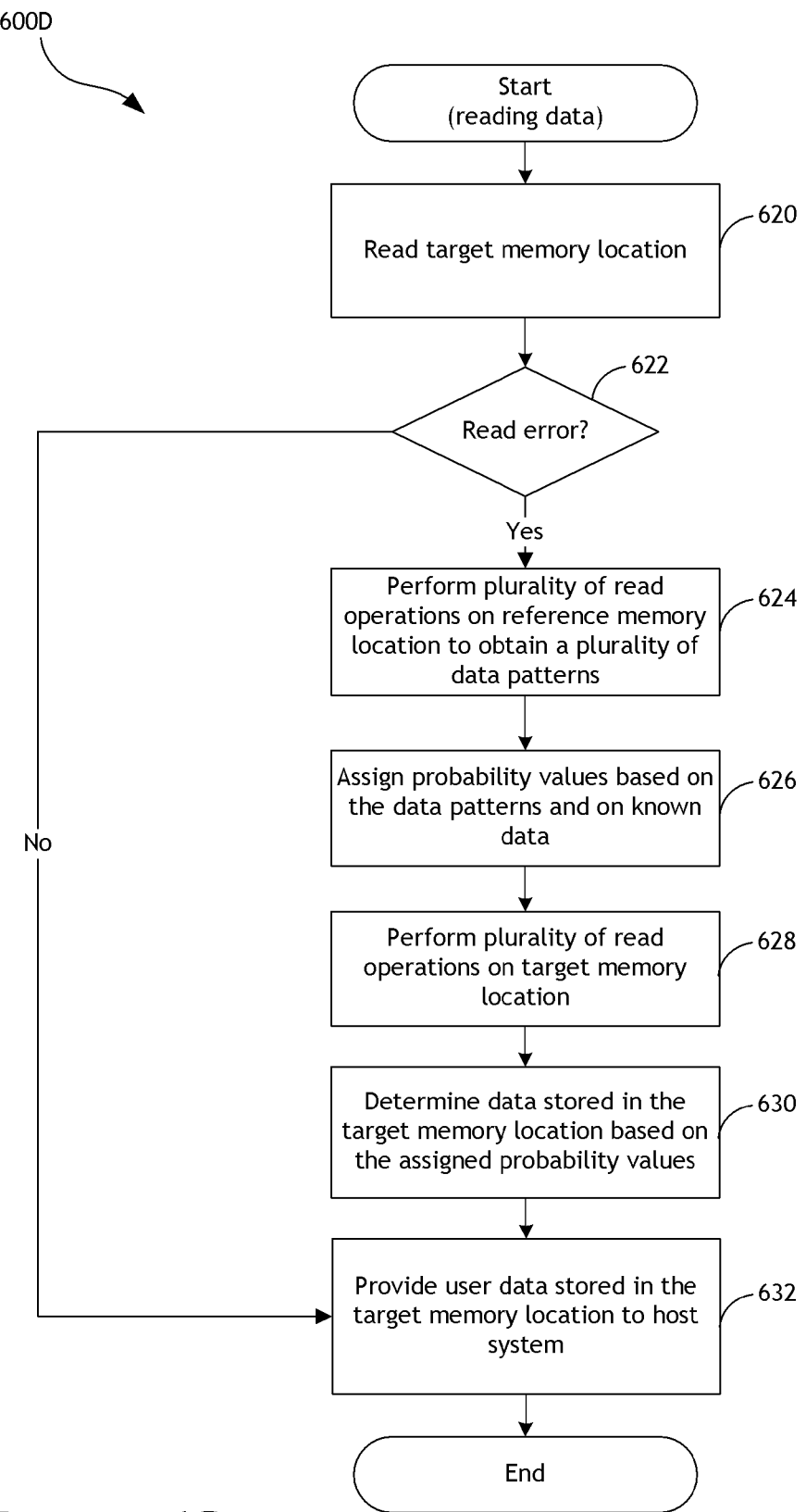

FIG. 6D is a flow diagram illustrating a process 600D for reading stored data using known training data according to the process 600A or using data that has been successfully decoded. In one embodiment, the process 600D detects and decodes data stored in a target memory location, such as a memory page. In block 620, the process 600D reads the target memory location. In block 622, the process 600D determines whether one or more read error(s) occurred while reading the target memory location. If no read error(s) have been encountered, the process 600D has successfully detected and decoded data stored in the target memory location. The process 600D transitions to block 632 where the retrieved data is returned to the host system 110.

If the process 600D encounters one or more read errors in block 622, the process transitions to blocks 624 and 626 where it performs operations similar to those performed in blocks 604 and 608 of FIG. 6B. The process 600D then transitions to block 628 where the process performs a plurality of read operations on the target memory location. In one embodiment, the process 600D performs operations of block 628 while the process performs operations of blocks 624 and 626. In another embodiment, the process 600D performs operations of block 628 before the process performs operations of blocks 624 and 626. The process 600D transitions to block 630 where it determines data stored in the target memory location based on the probability values assigned in block 626 and multi-read values determined in block 628. The process returns the retrieved data to the host system in block 632.

Figure 7:
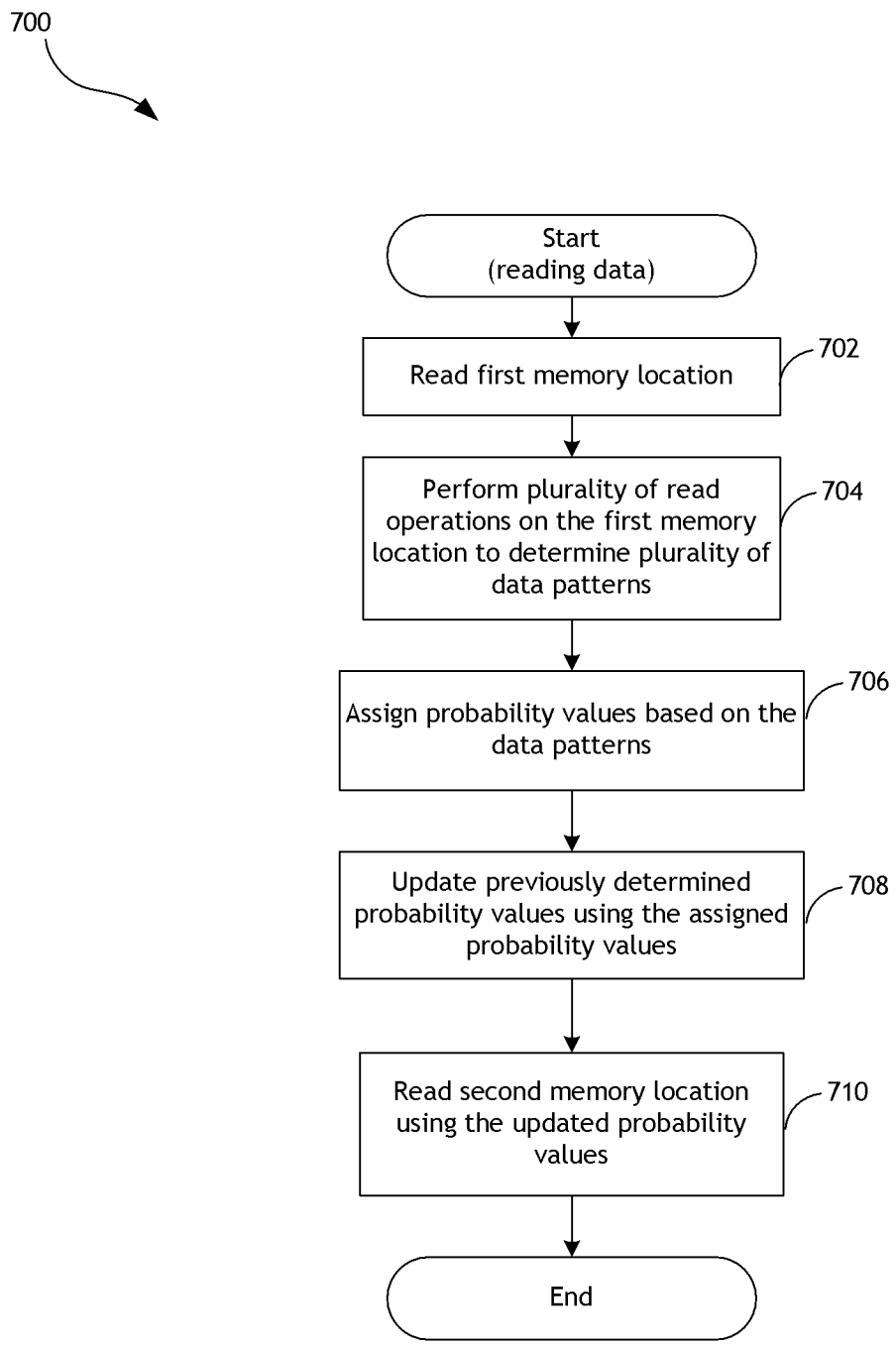
FIG. 7 is a flow diagram illustrating a process of reading stored data according to another embodiment of the invention.

FIG. 7 is a flow diagram illustrating a process 700 of reading stored data according to another embodiment of the invention. The illustrated process can be executed by the controller 130 and/or the data storage and error correction module 132. In one embodiment, the process 700 detects and decodes data stored in a memory location, such as a memory page, as part of performing read commands on multiple memory locations. The memory locations can be neighboring, such as consecutive, or be randomly located in the memory array 150.

In block 702, the process 700 performs a read operation on a first memory location, such as a memory page. The process 700 transitions to block 704 where it performs multiple read operations on the first memory location and determines a plurality of data patterns. These operations can be similar to those performed in block 604 as described above. The process 700 transitions to block 706 where it assigns probability values based on the data patterns determined in block 704. In one embodiment, data stored in the first memory location has been successfully detected and decoded in block 704. In block 706, the process 700 can assign the probability values based on the data patterns and on successfully decoded data (or known data). Operations performed in block 706 can be similar to those performed in block 606 as described above.

The process 700 transitions to block 708 where it updates previously determined probability values using the probability values assigned in block 706. In one embodiment, the process 700 can perform read operations on a number of memory locations, and the process can update the probability values, such as soft-decision data (e.g., LLRs), each time it successfully decodes and detects stored data. This way, the most up-to-date probability values are used for detecting and/or decoding data stored in a memory location being currently read. In another embodiment, the process 700 updates the probability values at any suitable time, such as after successfully detecting and decoding a number of memory locations.

The process 700 transitions to block 710 where it reads a second memory location. In one embodiment, the second memory location is a second memory page that is a neighbor of the first memory page. In another embodiment, the second memory location is any location in the memory array 150. The second memory location is detected and decoded using the updated probability values. The probability values can be soft-decision data, such as LLRs.

In one embodiment, the process 700 can utilize as known data successfully decoded and/or detected data stored in the first memory location. This way, the process does not use known training data stored in the memory array 150 or rely on information derived from such data. In another embodiment, the process 700 utilizes known training data in addition to or in place of the successfully decoded and/or detected data.

Conclusion

Disclosed embodiments can be used to estimate the amount of charge stored in a solid-state memory array cell without the need to install additional sensors, analog-to-digital converters, etc. in the memory array. Adding such additional components is associated with an increase in costs and decrease in the capacity of the memory array. Performing multiple read operations of the memory cells and calculating probabilities based on the results of the read operations can provide soft-decision information for the detection and decoding of stored data. Accordingly, reliability is improved and performance is increased.

Other Variations

Those skilled in the art will appreciate that in some embodiments, other suitable decoders can be used in addition to and/or in place of the LDPC decoder. For example, turbo decoders, Hamming decoders, Reed-Solomon decoders, BCH decoders, and the like can be used. Soft-decision information other than or in addition to LLRs can be generated and provided to the decoder. Any suitable method, such as a Markov model, hidden Markov model, Viterbi algorithm, SBGT BCJR, log-map BCJR, max-log-map BCJR, and the like, can be used to derive soft-decision information. In addition to or as an alternative to inter-cell interference, the present disclosure applies to decoding that takes into account and generates statistics and/or probability values for one or more of the following characteristics: inter-page interference, inter-block interference, P/E count, wear leveling, operating temperature, and the like. User data can encompass data provided by a host system, data generated internally by a data storage system, etc., and/or a combination thereof. The actual steps taken in the disclosed processes, such as the processes illustrated in FIGS. 6A-6D and 7, may differ from those shown in the figures. Additional system components can be utilized, and disclosed system components can be combined or omitted. Depending on the embodiment, certain of the steps described above may be removed, others may be added. Accordingly, the scope of the present disclosure is intended to be defined only by reference to the appended claims.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. For example, the systems and methods disclosed herein can be applied to hard disk drives, hybrid hard drives, and the like. In addition, other forms of storage (e.g., DRAM or SRAM, battery backed-up volatile DRAM or SRAM devices, EPROM, EEPROM memory, etc.) may additionally or alternatively be used. As another example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A data storage system, comprising:
a non-volatile solid-state memory array comprising a plurality of memory locations configured to store data; and
a controller configured to:
perform a plurality of read operations on a reference memory location to obtain a plurality of data patterns;
assign probability values based at least in part on the data patterns and on known data in the reference memory location; and
determine data stored in a target memory location based on the assigned probability values.

2. The storage system of claim 1, wherein the controller is further configured to perform the plurality of read operations on the reference memory location using a plurality of voltage thresholds.

3. The storage system of claim 1, wherein the controller is further configured to assign the probability values based on a number of occurrences of the data patterns.

4. The storage system of claim 3, wherein:
the reference memory location stores bit values $X_0$ to $X_{N-1}$; and
the assigned probability values include probability values determined based on the number of occurrences of the data patterns that is: (1) associated with $X_i$ and (2) correlated to a bit sequence including $X_i$ and one or more bit values neighboring $X_i$.

5. The storage system of claim 1, wherein the controller is configured to derive soft-information by applying a BCJR algorithm or a SOVA algorithm to the assigned probability values.

6. The storage system of claim 5, wherein the controller is configured to use the derived soft information to decode data stored in the target memory location.

7. The storage system of claim 5, wherein the soft information comprises log-likelihood ratios (LLRs).

8. The storage system of claim 1, wherein the controller is further configured to perform a plurality of read operations on the target memory location to determine the data stored in the target memory location.

9. The storage system of claim 1, wherein the known data comprises training data stored in the reference memory location prior to reading the target memory location.

10. The storage system of claim 1, wherein the target memory location has one or more properties similar to those of the reference memory location.

11. In a data storage system comprising a non-volatile solid state memory array having a plurality of memory locations configured to store data and a controller, a method of reading data, the method comprising:
performing a plurality of read operations on a reference memory location to obtain a plurality of data patterns;
assigning probability values based at least in part on the data patterns and on known data in the reference memory location;
reading a target memory location; and
determining data stored in the target memory location based on the assigned probability values,
wherein the method is performed under control of the controller.

12. The method of claim 11, wherein performing the plurality of read operations on the memory location comprises using a plurality of voltage thresholds.

13. The method of claim 11, further comprising assigning the probability values based on a number of occurrences of the data patterns.

14. The method of claim 13, wherein:
the reference memory location stores bit values $X_0$ to $X_{N-1}$; and
the assigned probability values include probability values determined based on the number of occurrences of the data patterns that is: (1) associated with $X_i$ and (2) correlated to a bit sequence including $X_i$ and one or more bit values neighboring $X_i$.

15. The method of claim 11, further comprising deriving soft-information by applying a BCJR algorithm or a SOVA algorithm to the assigned probability values.

16. The method of claim 15, further comprising decoding data stored in the target memory locations using the derived soft information.

17. The method of claim 15, wherein the soft information comprises log-likelihood ratios (LLRs).

18. The method of claim 11, further comprising performing a plurality of read operations on the target memory location to determine data stored in the target memory location.

19. The method of claim 11, wherein the known data comprises training data stored in the reference memory location prior to reading the target memory location.

20. The method of claim 11, wherein the target memory location has one or more properties similar to those of the reference memory location.

21. A data storage system, comprising:
a non-volatile solid state memory array comprising a plurality of memory locations configured to store data; and
a controller configured to determine log-likelihood ratios corresponding to data stored in the non-volatile memory array, the controller further configured to:
perform a plurality of read operations on a first memory location, the plurality of read data values forming a plurality of data patterns;
assign probability values based on the data patterns;
update a plurality of previously determined probability values using the assigned probability values; and
read a second memory location using the updated probability values.

22. The storage system of claim 21, wherein:
the first memory location stores bit values $X_1$ to $X_N$; and
the assigned probability values include probability values determined based on the number of occurrences of the data patterns that is: (1) associated with $X_i$ and (2) correlated to a bit sequence including $X_i$ and one or more bit values neighboring $X_i$.

23. The storage system of claim 21, wherein the controller is further configured to perform the plurality of read operations on the first memory location using a plurality of voltage thresholds.

24. The storage system of claim 21, wherein the first memory location comprises a first memory page and a second memory location comprises a second memory page neighboring the first memory page.

25. The storage system of claim 21, wherein the controller is configured to read the second memory location without using information derived from training data stored in the non-volatile solid state memory array.

26. In a data storage system comprising a non-volatile solid state memory array having a plurality of memory locations configured to store data and a controller, a method of reading data, the method comprising:
performing a plurality of read operations on a first memory location, the plurality of read data values forming a plurality of data patterns;
assigning probability values based on the data patterns;
updating a plurality of previously determined probability values using the assigned probability values; and
reading a second memory location using the updated probability values,
wherein the method is performed under control of the controller.

27. The method of claim 26, wherein:
the first memory location stores bit values $X_1$ to $X_N$; and
the assigned probability values include probability values determined based on the number of occurrences of the data patterns that is: (1) associated with $X_i$ and (2) correlated to a bit sequence including $X_i$ and one or more bit values neighboring $X_i$.

28. The method of claim 26, further comprising performing the plurality of read operations on the first memory location using a plurality of voltage thresholds.

29. The method of claim 26, wherein the first memory location comprises a first memory page and a second memory location comprises a second memory page neighboring the first memory page.

30. The method of claim 26, wherein reading the second memory location comprises reading without using information derived from training data stored in the non-volatile solid state memory array.

* * * * *